(12) United States Patent
Nakamura et al.

(10) Patent No.: US 11,329,450 B2
(45) Date of Patent: May 10, 2022

(54) ELECTRO-ABSORPTION OPTICAL MODULATOR AND MANUFACTURING METHOD THEREOF

(71) Applicant: Lumentum Japan, Inc., Kanagawa (JP)

(72) Inventors: Atsushi Nakamura, Nagano (JP); Takeshi Kitatani, Tokyo (JP); Kaoru Okamoto, Kanagawa (JP); Shigenori Hayakawa, Tokyo (JP)

(73) Assignee: Lumentum Japan, Inc., Kanagawa (JP)

( * ) Notice: Subject to any disclaimer, the term of this patent is extended or adjusted under 35 U.S.C. 154(b) by 14 days.

(21) Appl. No.: 16/845,234

(22) Filed: Apr. 10, 2020

(65) Prior Publication Data
US 2021/0057885 A1 Feb. 25, 2021

(30) Foreign Application Priority Data

Aug. 19, 2019 (JP) .............................. JP2019-150056
Oct. 7, 2019 (JP) .............................. JP2019-184664

(51) Int. Cl.
*H01S 5/026* (2006.01)
*H01S 5/343* (2006.01)
*H01S 5/06* (2006.01)

(52) U.S. Cl.
CPC .......... *H01S 5/0265* (2013.01); *H01S 5/0601* (2013.01); *H01S 5/34326* (2013.01); *H01S 2304/04* (2013.01)

(58) Field of Classification Search
CPC .. H01S 5/0265; H01S 5/34326; H01S 5/0601; H01S 2304/04
See application file for complete search history.

(56) References Cited

U.S. PATENT DOCUMENTS

2004/0062282 A1* 4/2004 Matsuoka ........... G02F 1/01725
372/26

FOREIGN PATENT DOCUMENTS

JP 2012-220530 A 11/2012

\* cited by examiner

*Primary Examiner* — Michael Carter
(74) *Attorney, Agent, or Firm* — Harrity & Harrity, LLP

(57) ABSTRACT

A electro-absorption optical modulator includes a multiple quantum well composed of a plurality of layers including a plurality of quantum well layers and a plurality of barrier layers that are alternately stacked, the plurality of quantum well layers and the plurality of barrier layers including an acceptor and a donor; a p-type semiconductor layer in contact with an uppermost layer of the plurality of layers; and an n-type semiconductor layer in contact with a lowermost layer of the plurality of layers, the multiple quantum well being 10% or more and 150% or less of the p-type semiconductor layer in a p-type carrier concentration, and in the multiple quantum well, an effective carrier concentration which corresponds to a difference between the p-type carrier concentration and an n-type carrier concentration is ±10% or less of the p-type carrier concentration of the multiple quantum well.

20 Claims, 5 Drawing Sheets

ELECTRO-ABSORPTION OPTICAL MODULATOR AND MANUFACTURING METHOD THEREOF

CROSS-REFERENCE TO RELATED APPLICATIONS

The present application claims priority from Japanese patent applications JP 2019-150056, filed on Aug. 19, 2019, and JP 2019-184664, filed on Oct. 7, 2019, the contents of which are hereby incorporated by reference into this application.

TECHNICAL FIELD

The present disclosure relates to an electro-absorption optical modulator and a method for manufacturing the same.

BACKGROUND

In recent years, in an electro-absorption optical modulator (EA modulator), in order to make the electric field in the multiple quantum well (MQW) uniform, it is preferable that the carrier concentration of the MQW is low. On the other hand, when a separate confinement heterostructure (SCH) is applied, it is preferable that the carrier concentration is high in the SCH layers above and below the MQW in order to avoid an increase in voltage loss.

In the metal organic chemical vapor deposition (MOCVD), which is often used for crystal growth of optical semiconductor elements, Zn (zinc) is mainly used as a p-type dopant. Zn easily diffuses during crystal growth. Therefore, the carrier concentration of the p-side SCH layer decreases and the carrier concentration of the MQW increases.

SUMMARY

According to some possible implementations, an electro-absorption optical modulator includes a multiple quantum well composed of a plurality of layers including a plurality of quantum well layers and a plurality of barrier layers that are alternately stacked, the plurality of quantum well layers and the plurality of barrier layers including an acceptor and a donor; a p-type semiconductor layer in contact with an uppermost layer of the plurality of layers; and an n-type semiconductor layer in contact with a lowermost layer of the plurality of layers, the multiple quantum well being 10% or more and 150% or less of the p-type semiconductor layer in a p-type carrier concentration, and in the multiple quantum well, an effective carrier concentration which corresponds to a difference between the p-type carrier concentration and an n-type carrier concentration is ±10% or less of the p-type carrier concentration of the multiple quantum well.

According to some possible implementations, a method for manufacturing an electro-absorption optical modulator includes forming an n-type semiconductor layer; forming a multiple quantum well composed of a plurality of layers including a plurality of quantum well layers and a plurality of barrier layers that are alternately stacked, the plurality of quantum well layers and the plurality of barrier layers including an acceptor and a donor, and a lowermost layer, of the plurality of layers, is placed in contact with the n-type semiconductor layer; and forming a p-type semiconductor layer by metal organic chemical vapor deposition to be placed in contact with an uppermost layer of the plurality of layers, the multiple quantum well being 10% or more and 150% or less of the p-type semiconductor layer in a p-type carrier concentration, and in the multiple quantum well, an effective carrier concentration which corresponds to a difference between the p-type carrier concentration and an n-type carrier concentration is ±10% or less of the p-type carrier concentration of the multiple quantum well.

DETAILED DESCRIPTION

The following detailed description of example implementations refers to the accompanying drawings. The same reference numbers in different drawings may identify the same or similar elements.

Figure 1:
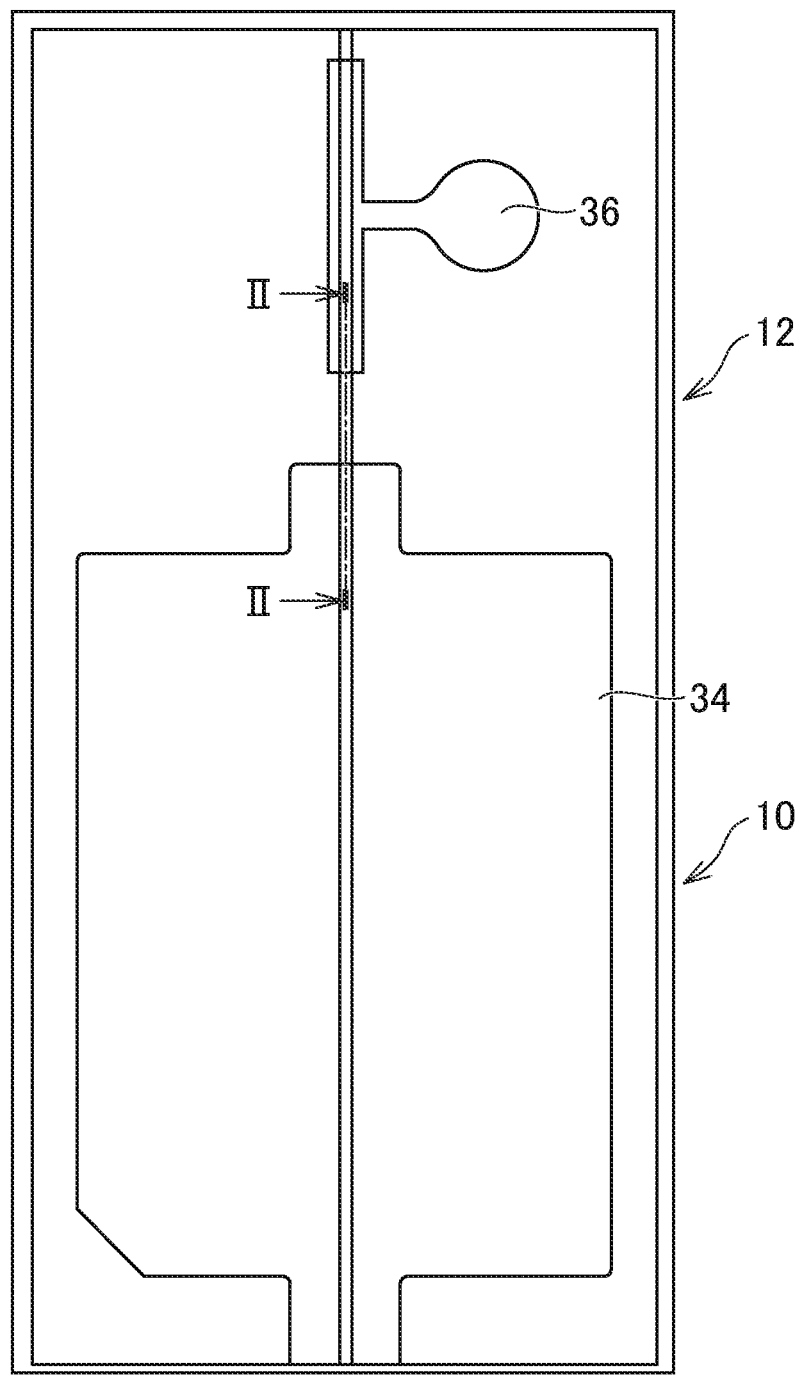
FIG. 1 is a plan view of an electro-absorption optical modulator according to an example.
Figure 2:
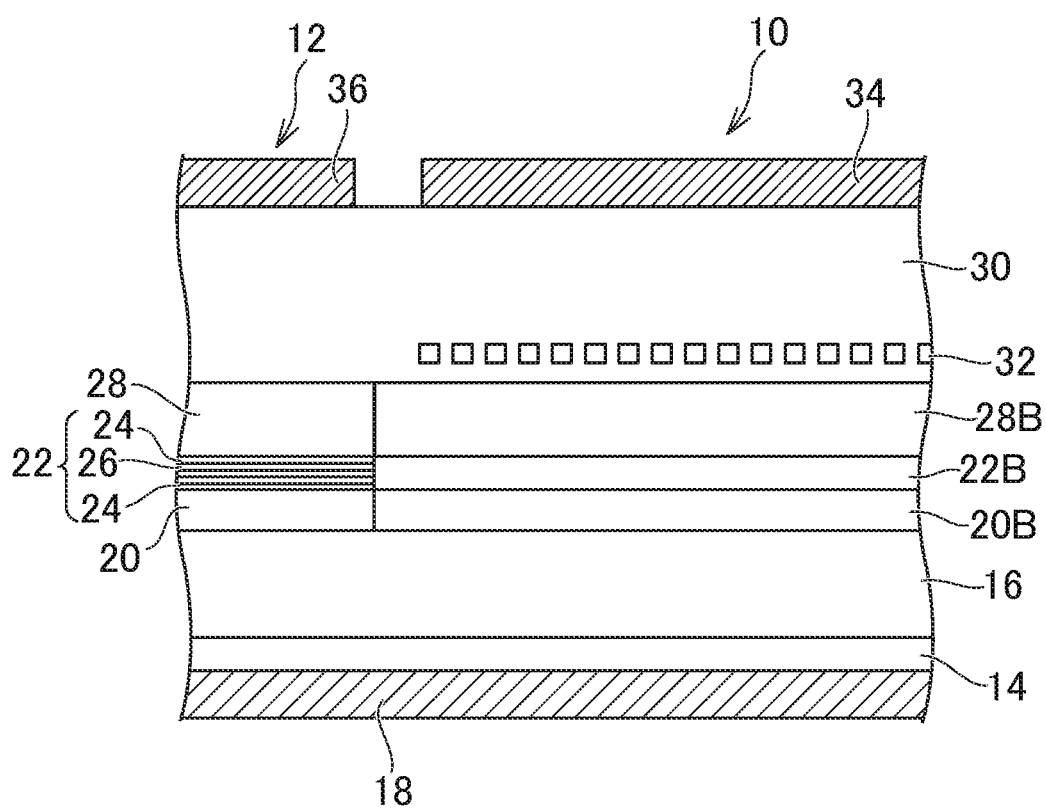
FIG. 2 is a cross-sectional view of the electro-absorption optical modulator illustrated in FIG. 1 taken along the line II-II.

FIG. 1 is a plan view of an electro-absorption optical modulator according to an implementation. FIG. 2 is a cross-sectional view of the electro-absorption optical modulator illustrated in FIG. 1 taken along the line II-II.

The electro-absorption optical modulator is a modulator integrated semiconductor optical element (for example, a modulator integrated laser) in which a laser unit 10 and a modulation unit 12 are monolithically integrated. The electro-absorption optical modulator modulates continuous light emitted by injecting a drive current into the laser unit 10, by the modulation unit 12, and outputs signal light.

The laser unit 10 is a distributed feedback semiconductor laser (Distributed Feedback Laser: DFB laser). The modulation unit 12 is an electro-absorption modulator (EA modulator). The electro-absorption modulator is widely used since the electro-absorption modulator is small and at low cost in addition to advantageous characteristics such as a small chirp (wavelength variation), a large extinction ratio that is the difference between the ON level and the OFF level of the optical signal, and a wide band. Here, the electro-absorption optical modulator is an EA modulator integrated DFB laser element.

The electro-absorption optical modulator has a buried heterostructure (BH structure) (not illustrated). The BH structure refers to a structure having buried layers on both sides of a mesa stripe structure having an optical waveguide. The BH structure has a strong effect of confining light in the lateral direction, and far field pattern (FFP) is more circular. Therefore, the BH structure is widely used due to the advantage of high coupling efficiency with an optical fiber, and excellent heat dissipation.

As illustrated in FIG. 2, the electro-absorption optical modulator includes a semiconductor substrate 14 (n-type InP substrate). A lower cladding layer 16 (n-type InP layer) is stacked on the semiconductor substrate 14. On the back surface of the semiconductor substrate 14 (the surface opposite to the lower cladding layer 16), there is an electrode 18 (for example, a cathode).

[n-Type Semiconductor Layer (Lower SCH Layer)]

The electro-absorption optical modulator (modulation unit 12) includes an n-type semiconductor layer 20 (InGaAsP layer) on the lower cladding layer 16. The donor (n-type dopant) of the n-type semiconductor layer 20 is Si. Si is known to have little diffusion during crystal growth. The n-type semiconductor layer 20 is for forming a separate confinement heterostructure (SCH) and is also a lower SCH layer.

[Multiple Quantum Well of Modulation Unit]

The electro-absorption optical modulator (modulation unit 12) includes a multiple quantum well (MQW) 22. When an electric field is applied to the multiple quantum well 22, a quantum confined Stark effect (QCSE) in which the absorption edge of light shifts to the longer wavelength side is obtained. The modulation unit 12 modulates light using QCSE. The multiple quantum well 22 is composed of a plurality of layers, and the lowermost layer thereof is in contact with the n-type semiconductor layer 20. The lowest layer of the plurality of layers is a barrier layer 24 (InGaAsP layer). The uppermost layer of the plurality of layers is also a barrier layer 24. The plurality of layers includes a plurality of barrier layers 24. The plurality of barrier layers 24 contain both an acceptor (p-type dopant) and a donor (n-type dopant). Each of the p-type carrier concentration and the n-type carrier concentration of the plurality of barrier layers 24 is $1 \times 10^{17}$ cm$^{-3}$ or more. The acceptor is at least one of Zn or Mg. The donor is Si (the same material as the donor of the n-type semiconductor layer 20).

The plurality of layers include a plurality of quantum well layers 26 (InGaAsP layers). The plurality of quantum well layers 26 contain both an acceptor (p-type dopant) and a donor (n-type dopant). Each of the p-type carrier concentration and the n-type carrier concentration of the plurality of quantum well layers 26 is $1 \times 10^{17}$ cm$^{-3}$ or more. The acceptor is at least one of Zn or Mg. The donor is Si (the same material as the donor of the n-type semiconductor layer 20). The quantum well layer 26 and the barrier layer 24 are adjacent to each other. That is, the plurality of quantum well layers 26 and the plurality of barrier layers 24 are alternately stacked. That is, the multiple quantum well 22 contains both acceptors and donors over the entire region.

[p-Type Semiconductor Layer (Upper SCH Layer)]

The electro-absorption optical modulator (modulation unit 12) includes a p-type semiconductor layer 28 (InGaAsP layer). The acceptor of the p-type semiconductor layer 28 is, for example, at least one of Zn or Mg (the same material as the acceptor of the quantum well layer 26), and reducing diffusion thereof is extremely difficult. The p-type semiconductor layer 28 is in contact with the uppermost layer of the multiple quantum well 22. The p-type semiconductor layer 28 is for forming a separate confinement heterostructure (SCH) and is also an upper SCH layer. An upper cladding layer 30 (p-type InP layer) is stacked on the p-type semiconductor layer 28.

[Structure of Laser Unit]

The electro-absorption optical modulator includes an n-type semiconductor layer 20B, a multiple quantum well 22B, and a p-type semiconductor layer 28B in the laser unit 10. The details thereof correspond to the contents of the n-type semiconductor layer 20, the multiple quantum well 22 and the p-type semiconductor layer 28 of the modulation unit 12. In the laser unit 10, the upper cladding layer 30 is stacked on a diffraction grating layer 32. The diffraction grating layer 32 and the multiple quantum well 22 are set so that the oscillation wavelength is in the 1.3 µm band or 1.55 µm band.

[Electrode]

The laser unit 10 includes an electrode 34 (for example, an anode) for applying a DC voltage together with an electrode 18 (for example, a cathode). The modulation unit 12 includes an electrode 36 (for example, an anode) for applying an AC voltage together with the electrode 18 (for example, a cathode). The electrode 18 used in the laser unit 10 and the modulation unit 12 is integrated, but may be separate. The modulation unit 12 and the laser unit 10 may not be integrated on the same semiconductor substrate 14. For example, the modulation unit 12 and the laser unit 10 may be formed on different semiconductor substrates 14 and mounted in a region where the modulation unit 12 and the laser unit 10 have the same potential.

[Carrier Concentration]

Figure 3:
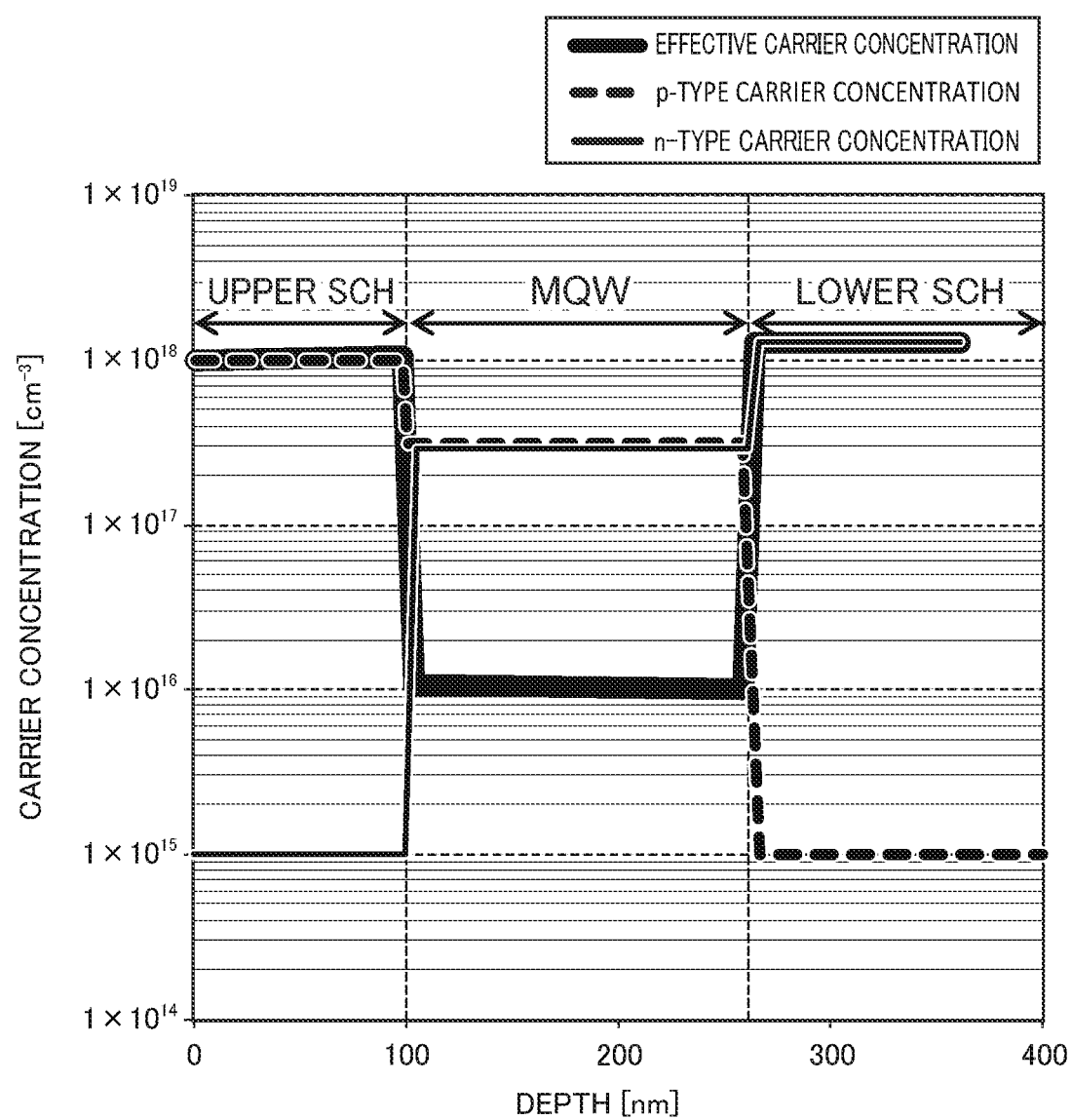
FIG. 3 is a diagram illustrating carrier concentrations of an n-type semiconductor layer (lower SCH), a multiple quantum well (MQW), and a p-type semiconductor layer (upper SCH).

FIG. 3 is a diagram illustrating carrier concentrations of the n-type semiconductor layer 20 (lower SCH), the multiple quantum well (MQW) 22, and the p-type semiconductor layer 28 (upper SCH).

The p-type semiconductor layer 28 (upper SCH) is doped with $1 \times 10^{18}$ cm$^{-3}$ of p-type carriers (Zn). The multiple quantum well (MQW) 22 is doped with both $3.0 \times 10^{17}$ cm$^{-3}$ of p-type carriers (Zn) and $2.9 \times 10^{17}$ cm$^{-3}$ of n-type carriers (Si). The n-type semiconductor layer 20 (lower SCH) is doped with $1 \times 10^{18}$ cm$^{-3}$ of n-type carriers (Si).

Since both the p-type semiconductor layer 28 (upper SCH) and the multiple quantum well (MQW) 22 are doped with p-type carriers (Zn), the diffusion of p-type carriers (Zn) from the p-type semiconductor layer 28 (upper SCH) to the multiple quantum well (MQW) 22 is reduced. On the other hand, since there is almost no diffusion during crystal growth of the n-type carriers (Si), the difference (effective carrier concentration) between the p-type carrier concentration and the n-type carrier concentration in the multiple quantum well (MQW) 22 can be reduced to about $1 \times 10^{16}$ cm$^{-3}$ while the p-type carrier concentration of the p-type semiconductor layer 28 (upper SCH) is maintained.

The multiple quantum well (MQW) 22 is 10% or more and 150% or less of the p-type semiconductor layer 28 (upper SCH) ($1 \times 10^{18}$ cm$^{-3}$) in the p-type carrier concentration ($3.0 \times 10^{17}$ cm$^{-3}$). In the present example, the multiple quantum well (MQW) 22 is lower than the p-type semiconductor layer 28 (upper SCH) in the p-type carrier concentration. The multiple quantum well (MQW) 22 is lower than the n-type semiconductor layer 20 (lower SCH) ($1 \times 10^{18}$ cm$^{-3}$) in the n-type carrier concentration ($2.9 \times 10^{17}$ cm$^{-3}$).

In multiple quantum well (MQW) 22, an effective carrier concentration ($1 \times 10^{16}$ cm$^{-3}$) which corresponds to the difference (absolute value) between the p-type carrier concentration and the n-type carrier concentration is 10% or less of the p-type carrier concentration ($3.0 \times 10^{17}$ cm$^{-3}$) of the multiple quantum well (MQW) 22. In the multiple quantum well (MQW) 22, the p-type carrier concentration ($3.0 \times 10^{17}$ cm$^{-3}$) is higher than the n-type carrier concentration ($2.9 \times 10^{17}$ cm$^{-3}$).

According to an implementation, since the multiple quantum well (MQW) 22 has a high p-type carrier concentration, it is possible to reduce the diffusion of acceptors from the p-type semiconductor layer 28 (upper SCH) and to ensure an appropriate carrier concentration. On the other hand, the multiple quantum well (MQW) 22 has a low effective carrier concentration in order to make the electric field uniform. According to an implementation, the modulation characteristic of the electro-absorption modulator can be improved. That is, a large extinction ratio can be obtained with a low voltage amplitude.

[Manufacturing Method]

Next, a method for manufacturing an electro-absorption optical modulator will be described. In the present example, the modulation unit 12 is formed after the laser unit 10 is formed (see FIG. 2).

In the formation process of the laser unit 10, a multilayer necessary for the structure of the laser unit 10 is formed on the semiconductor substrate 14 (n-type InP substrate), and then unnecessary portions of the laser unit 10 are removed by etching.

Next, in the formation process of the modulation unit 12, the n-type semiconductor layer 20 (InGaAsP layer), the multiple quantum well 22, and the p-type semiconductor layer 28 (InGaAsP layer) are formed on the semiconductor substrate 14 (n-type InP substrate). Each layer is formed by the metal organic chemical vapor deposition (MOCVD). Both the quantum well layer 26 and the barrier layer 24 are made of InGaAsP, and perform multilayer growth while adding both Zn (p-type dopant) and Si (n-type dopant).

The growth conditions are adjusted so that the multiple quantum well 22 is 10% or more and 150% or less of the p-type semiconductor layer 28 in the p-type carrier concentration. The growth conditions are adjusted so that the effective carrier concentration (the absolute value of the difference between the p-type carrier concentration and the n-type carrier concentration) is 10% or less of the p-type carrier concentration of the multiple quantum well 22 in the multiple quantum well 22. Other details include the contents obvious from the above description of the electro-absorption optical modulator and the well-known technique of the metal organic chemical vapor deposition.

[Modification 1]

Figure 4:
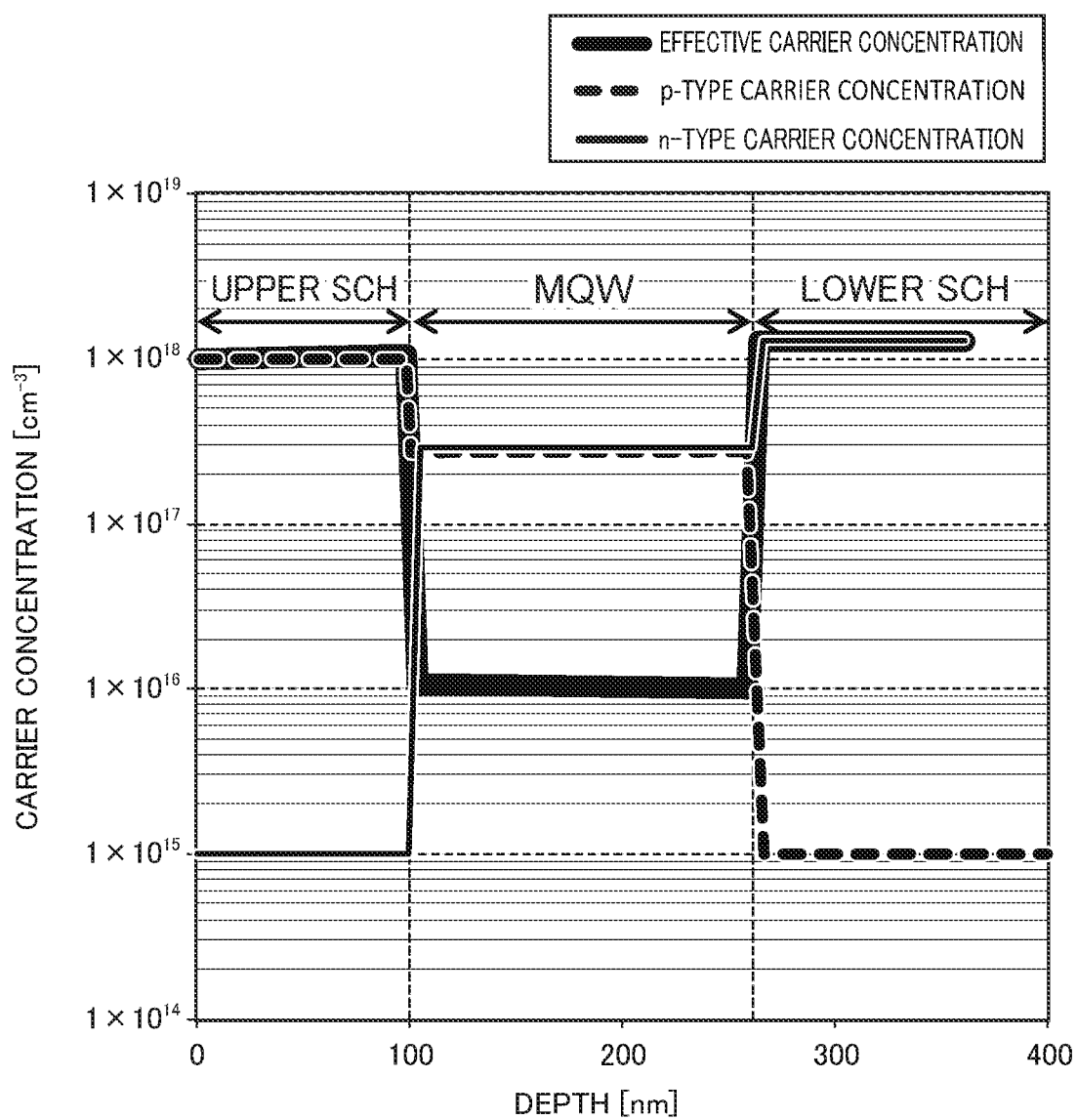
FIG. 4 is a diagram illustrating a carrier concentration in Modification 1 of the electro-absorption optical modulator.

FIG. 4 is a diagram illustrating a carrier concentration in Modification 1 of the electro-absorption optical modulator. In the present modification, in the multiple quantum well (MQW), the p-type carrier concentration ($2.9 \times 10^{17}$ cm$^{-3}$) is lower than the n-type carrier concentration ($3.0 \times 10^{17}$ cm$^{-3}$). That is, the effective carrier concentration of the multiple quantum well 22 is ±10% or less of the p-type carrier concentration.

[Modification 2]

Figure 5:
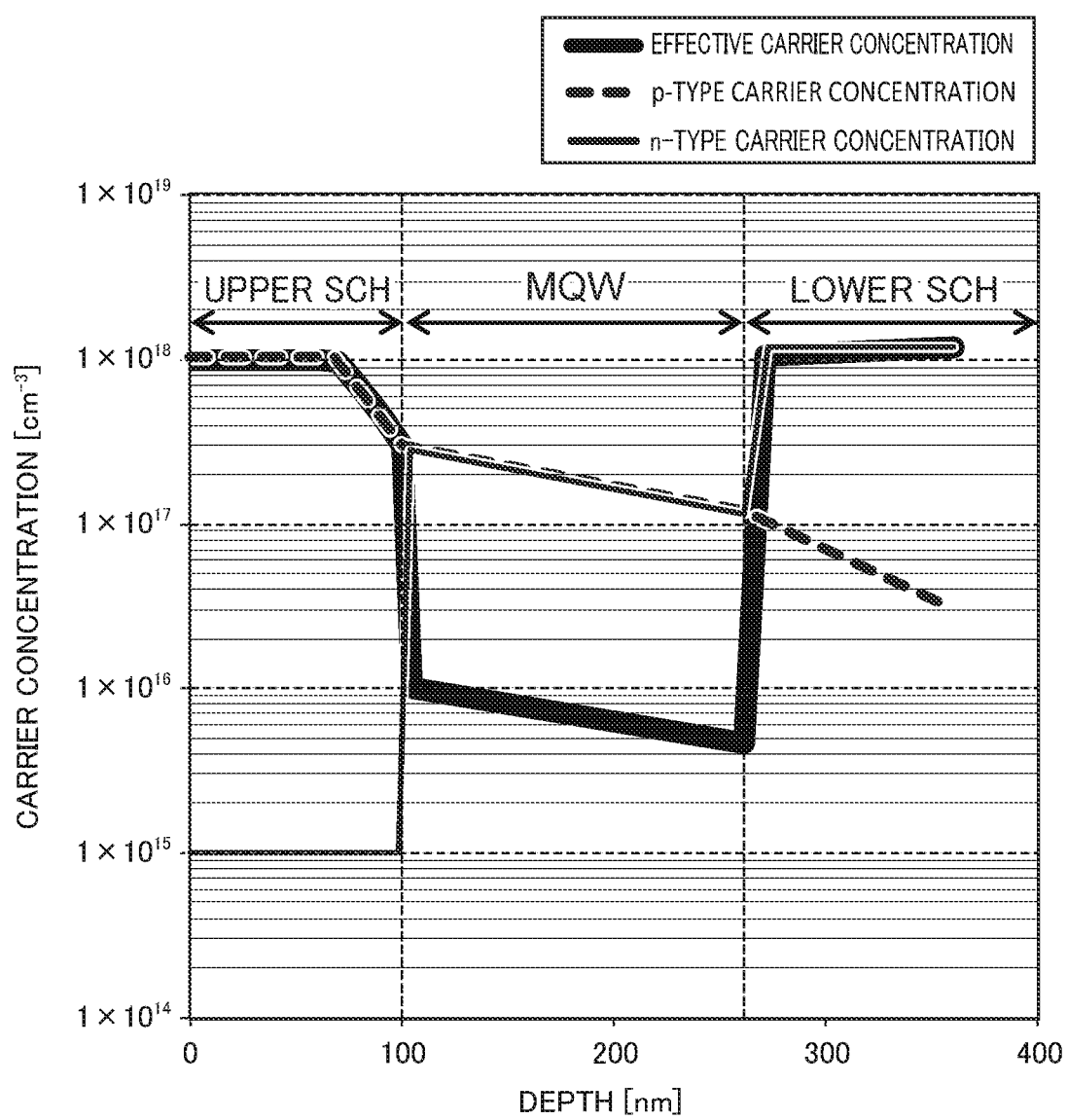
FIG. 5 is a diagram illustrating a carrier concentration in Modification 2 of the electro-absorption optical modulator.

FIG. 5 is a diagram illustrating a carrier concentration in Modification 2 of the electro-absorption optical modulator. In the present modification, the p-type carrier concentration and the n-type carrier concentration of the plurality of layers constituting the multiple quantum well (MQW) are higher as a layer is closer to the p-type semiconductor layer (upper SCH). This indicates a state where the p-type dopant contained in the upper cladding layer 30 (p-type InP layer) or the p-type semiconductor layer 28 has diffused into the multiple quantum well 22. The p-type dopant has an amount increased by the diffusion in addition to the amount added when the multiple quantum well 22 is formed. In order to compensate for the increased amount, an n-type dopant is added to form the profile illustrated in FIG. 4 when the multiple quantum well 22 is formed. Thus, by adjusting the profile of the n-type dopant (n-type carrier concentration distribution) according to the diffusion state of the p-type dopant, an electro-absorption optical modulator excellent in high extinction ratio characteristics can be realized.

While there have been described what are at present considered to be certain implementations, it will be understood that various modifications may be made thereto, and it is intended that the appended claims cover all such modifications as fall within the true spirit and scope of the implementations. For example, the EA modulator integrated DFB laser element has been described. However, only the EA modulator may be applied.

The foregoing disclosure provides illustration and description, but is not intended to be exhaustive or to limit the implementations to the precise forms disclosed. Modifications and variations may be made in light of the above disclosure or may be acquired from practice of the implementations.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. An electro-absorption optical modulator comprising:
    a multiple quantum well;
    a p-type semiconductor layer in contact with a first portion of the multiple quantum well; and
    an n-type semiconductor layer in contact with a second portion of the multiple quantum well,
        the multiple quantum well being 10% or more and 150% or less of the p-type semiconductor layer in a p-type carrier concentration, and
        in the multiple quantum well, an effective carrier concentration which corresponds to a difference between the p-type carrier concentration and an n-type carrier concentration is ±10% or less of the p-type carrier concentration of the multiple quantum well.

2. The electro-absorption optical modulator of claim 1, wherein the p-type semiconductor layer and the n-type semiconductor layer are configured to form a separate confinement heterostructure.

3. The electro-absorption optical modulator of claim 1, wherein each of an uppermost layer of the multiple quantum well and a lowermost layer of the multiple quantum well corresponds to one of a plurality of barrier layers of the multiple quantum well.

4. The electro-absorption optical modulator of claim 1, wherein each of the p-type carrier concentration and the n-type carrier concentration is $1 \times 10^{17}$ cm$^{-3}$ or more.

5. The electro-absorption optical modulator of claim 1, wherein, in the multiple quantum well, the p-type carrier concentration is higher than the n-type carrier concentration.

6. The electro-absorption optical modulator of claim 1, wherein, in the multiple quantum well, the p-type carrier concentration is lower than the n-type carrier concentration.

7. The electro-absorption optical modulator of claim 1, wherein an acceptor of the multiple quantum well is at least one of Zn or Mg.

8. The electro-absorption optical modulator of claim 1, wherein a donor of the multiple quantum well is Si.

9. The electro-absorption optical modulator of claim 1, wherein an acceptor of the p-type semiconductor layer is the same material as an acceptor of the multiple quantum well.

10. The electro-absorption optical modulator of claim 1, wherein a donor of the n-type semiconductor layer is the same material as a donor of the multiple quantum well.

11. The electro-absorption optical modulator of claim 1, wherein the multiple quantum well is lower than the p-type semiconductor layer in the p-type carrier concentration.

12. The electro-absorption optical modulator of claim 1, wherein the multiple quantum well is lower than the n-type semiconductor layer in the n-type carrier concentration.

13. The electro-absorption optical modulator of claim 1, wherein the p-type carrier concentration and the n-type carrier concentration are higher as a layer, of a plurality of layers of the multiple quantum well, is closer to the p-type semiconductor layer.

14. A method for manufacturing an electro-ab sorption optical modulator comprising:
    forming an n-type semiconductor layer;
    forming a multiple quantum well, and
        first portion of the multiple quantum well is placed in contact with the n-type semiconductor layer; and
    forming a p-type semiconductor layer in contact with a second portion of the multiple quantum well,
        the multiple quantum well being 10% or more and 150% or less of the p-type semiconductor layer in a p-type carrier concentration, and
    in the multiple quantum well, an effective carrier concentration which corresponds to a difference between the p-type carrier concentration and an n-type carrier concentration is ±10% or less of the p-type carrier concentration of the multiple quantum well.

15. The method for manufacturing of claim 14, wherein the multiple quantum well is formed by metal organic chemical vapor deposition.

16. The method for manufacturing of claim 14, wherein the p-type semiconductor layer and the n-type semiconductor layer are configured to form a separate confinement heterostructure.

17. The method for manufacturing of claim 14, wherein
    an acceptor of the multiple quantum well is at least one of Zn or Mg, and
    a donor of the multiple quantum well is Si.

18. The method for manufacturing of claim 14, wherein at least one of:
    an acceptor of the p-type semiconductor layer is the same material as an acceptor of the multiple quantum well, or
    a donor of the n-type semiconductor layer is the same material as a donor of the multiple quantum well.

19. The method for manufacturing of claim 14, wherein at least one of:
    the multiple quantum well is lower than the p-type semiconductor layer in the p-type carrier concentration, or
    the multiple quantum well is lower than the n-type semiconductor layer in the n-type carrier concentration.

20. The method for manufacturing of claim 14, wherein the p-type carrier concentration and the n-type carrier concentration are higher as a layer, of a plurality of layers of the multiple quantum well, is closer to the p-type semiconductor layer.

* * * * *

UNITED STATES PATENT AND TRADEMARK OFFICE
CERTIFICATE OF CORRECTION

| | |
|---|---|
| PATENT NO. | : 11,329,450 B2 |
| APPLICATION NO. | : 16/845234 |
| DATED | : May 10, 2022 |
| INVENTOR(S) | : Nakamura et al. |

It is certified that error appears in the above-identified patent and that said Letters Patent is hereby corrected as shown below:

In the Claims

Column 6, Line 41, change "An electro-ab sorption optical modulator comprising:" to --An electro-absorption optical modulator comprising:--

Column 7, Line 29, change "A method for manufacturing an electro-ab sorption" to --A method for manufacturing an electro-absorption--

Signed and Sealed this
Fourteenth Day of June, 2022

Katherine Kelly Vidal
*Director of the United States Patent and Trademark Office*